United States Patent
Terazawa et al.

(10) Patent No.: US 8,476,954 B2
(45) Date of Patent: Jul. 2, 2013

(54) PULSE GENERATION CIRCUIT

(75) Inventors: Tatsuya Terazawa, Kasugai (JP); Sozaburo Hotta, Nagoya (JP); Yuji Watanabe, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 22 days.

(21) Appl. No.: 13/306,160

(22) Filed: Nov. 29, 2011

(65) Prior Publication Data

US 2012/0139604 A1 Jun. 7, 2012

(30) Foreign Application Priority Data

Dec. 1, 2010 (JP) .................................. 2010-268189

(51) Int. Cl.
*H03K 3/00* (2006.01)
(52) U.S. Cl.
USPC .......................................... 327/291; 327/172
(58) Field of Classification Search
USPC .................. 327/172–174, 291, 293, 294, 299
See application file for complete search history.

(56) References Cited

U.S. PATENT DOCUMENTS 4,160,214 A * 7/1979 Colin et al. .................... 327/294
8,334,729 B1 * 12/2012 Khlat ............................... 333/32

FOREIGN PATENT DOCUMENTS

JP 2009-165201 A1 7/2009

* cited by examiner

*Primary Examiner* — An Luu
(74) *Attorney, Agent, or Firm* — Burr & Brown

(57) ABSTRACT

A DC source generates a DC voltage between a positive electrode and a negative electrode. An inductive element and a parallel-connected switch-circuits unit are provided in a conductive path extending from the positive electrode to the negative electrode. The parallel-connected switch-circuits unit includes a plurality of switch circuits connected in parallel with one another. The switch circuit opens and closes the conductive path in accordance with a drive signal inputted from a drive circuit. The drive signal causes the plurality of switch circuits to successively perform an ON operation in which the conductive path is closed and then opened. A pulse voltage generation period in which a pulse voltage occurs in the inductive element continuously follows an ON period which is a duration from when the conductive path is closed to when the conductive path is opened.

1 Claim, 2 Drawing Sheets

PULSE GENERATION CIRCUIT

BACKGROUND OF THE INVENTION

1. Field of the Invention

The present invention relates to a pulse generation circuit.

2. Description of Related Art

In a pulse generation circuit of an inductive energy storing type (hereinafter referred to as "IES circuit"), inductive elements such as an inductor and a transformer and a switching element, are provided in a conductive path extending from a positive electrode to a negative electrode of a DC source. In the IES circuit, when the switching element closes the conductive path, a current flows in the conductive path so that inductive energy is stored in the inductive element. In the IES circuit, when the switching element opens the conductive path in a state where the inductive energy is stored in the inductive element, a pulse voltage occurs in the inductive element because of self-inductance or mutual-inductance.

A first means for increasing a repetition frequency of the pulse voltage generated by the IES circuit is to select an appropriate circuit constant to thereby increasing a switching frequency of the switching element. However, the first means raises a problem that an efficiency of the pulse generation circuit is significantly lowered due to influences of a leakage inductance of the inductive element, a loss of the switching element, and the like.

A second means for increasing the repetition frequency of the pulse voltage generated by the IES circuit is to connect a plurality of IES circuits in parallel with one another and make a timing of generating the pulse voltage in one IES circuit different from that in another IES circuit, as disclosed in Japanese Patent Application Laid-Open No. 2009-165201. However, the second means raises a problem that a diode provided for preventing interference between the plurality of IES circuits hinders a feedback current from a load. Therefore, the second means is not employed in a case where there is a feedback current from the load.

SUMMARY OF THE INVENTION

The present invention is directed to a pulse generation circuit.

In a first aspect of the present invention, a pulse generation circuit includes a DC source, a conductive path, an inductive element, a parallel-connected switch-circuits unit, and a drive circuit.

The DC source generates a DC voltage between a positive electrode and a negative electrode.

The conductive path extends from the positive electrode to the negative electrode.

The inductive element and the parallel-connected switch-circuits unit are provided in the conductive path.

The parallel-connected switch-circuits unit includes a plurality of switch circuits. The plurality of switch circuits are connected in parallel with one another. Each of the plurality of switch circuits opens and closes the conductive path in accordance with a drive signal inputted thereto.

The drive circuit inputs the drive signal to each of the plurality of switch circuits. The drive signal causes the plurality of switch circuits to successively perform an ON operation. In the ON operation, the conductive path is closed and then opened.

An ON period is followed by a pulse voltage generation period. The ON period continues for a duration from when the parallel-connected switch-circuits unit closes the conductive path to when the parallel-connected switch-circuits unit opens the conductive path. In the pulse voltage generation period, a pulse voltage occurs in the inductive element.

The drive circuit inputs the drive signal to each of the plurality of switch circuits in such a manner that an OFF-period can be longer than the pulse voltage generation period. The OFF-period continues for a duration from when the conductive path is opened to the conductive path is closed.

The pulse generation circuit is adaptable even in a case where there is a feedback current from a load, so that a pulse voltage having a high repetition frequency can be generated without causing a significant reduction in efficiency.

Therefore, an object of the present invention is to provide a pulse generation circuit that is adaptable in a case where there is a feedback current from a load and that can generate a pulse voltage having a high repetition frequency without causing a significant reduction in efficiency.

These and other objects, features, aspects and advantages of the present invention will become more apparent from the following detailed description of the present invention when taken in conjunction with the accompanying drawings.

DESCRIPTION OF THE PREFERRED EMBODIMENTS

[Outline of the Pulse Generation Circuit]

Figure 1:
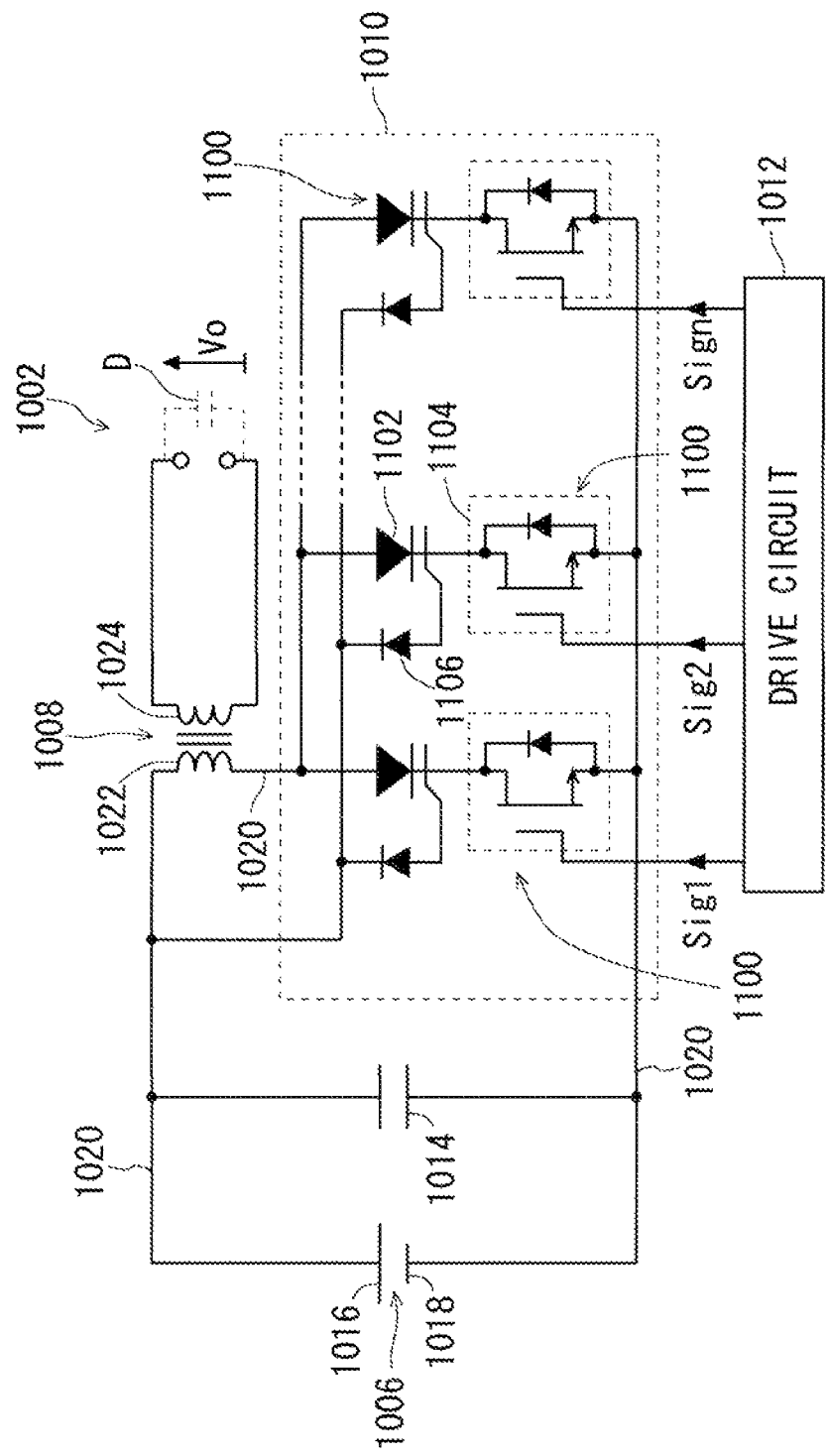
FIG. 1 is a circuit diagram of a pulse generation circuit.

FIG. 1 is a circuit diagram of a pulse generation circuit according to one preferred embodiment of the present invention.

As shown in FIG. 1, a pulse generation circuit 1002 includes a DC source 1006, a transformer 1008, a parallel-connected switch-circuits unit 1010, a drive circuit 1012, and a capacitor 1014. The pulse generation circuit 1002 is a power source of inductive energy storing type that discharges, in a short time, inductive energy stored in an inductive element.

The DC source 1006 configured by a battery or the like generates a DC voltage between a positive electrode 1016 and a negative electrode 1018. In a conductive path 1020 extending from the positive electrode 1016 to the negative electrode 1018 of the DC source 1006, a primary winding 1022 of the transformer 1008 and the parallel-connected switch-circuits unit 1010 are provided. One end of the primary winding 1022 of the transformer 1008 is connected to the positive electrode 1016 of the DC source 1006, and the other end of the primary winding 1022 of the transformer 1008 is connected to one end of the parallel-connected switch-circuits unit 1010. The other end of the parallel-connected switch-circuits unit 1010 is connected to the negative electrode 1018 of the DC source 1006. The capacitor 1014 is connected in parallel with the DC source 1006.

When the parallel-connected switch-circuits unit 1010 closes the conductive path 1020, a current flows in the conductive path 1020 so that inductive energy is stored in the transformer 1008. When, in a state where the inductive energy is stored in the transformer 1008, the parallel-connected switch-circuits unit 1010 opens the conductive path 1020, a pulse voltage occurs in a secondary winding 1024 of the transformer 1008 because of mutual-inductance. Accordingly, a pulse voltage generation period in which the pulse voltage occurs in the secondary winding 1024 of the transformer 1008 follows an ON period which is a duration from when the parallel-connected switch-circuits unit 1010 closes the conductive path 1020 to when the parallel-connected switch-circuits unit 1010 opens the conductive path 1020.

It is not essential that an inductive element is the transformer 1008, but instead it may be acceptable that an inductor is provided at a position where the primary winding 1022 of the transformer 1008 is provided, so that a pulse voltage occurs at both ends of the inductor.

The pulse voltage occurring in the secondary winding 1024 of the transformer 1008 is applied to a discharger D connected in parallel with the secondary winding 1024 of the transformer 1008. The pulse generation circuit 1002 can normally operate, even in a case where the discharger D is a capacitive load such as a pair of opposed electrodes and, if a pulse voltage is applied to the discharger D, a kickback occurs to cause a back-flow of a current from the discharger D to the pulse generation circuit 1002.

[Driving of Switch Circuit]

In the parallel-connected switch-circuits unit 1010, a plurality of switch circuits 1100 are connected in parallel. The first, the second, ... and the n-th switch circuits 1100 open and close the conductive path 1020 in accordance with drive signals Sig1, Sig2, . . . and Sig"n" inputted thereto, respectively. The drive signals Sig1, Sig2, . . . and Sig"n" are independent of one another, and the first, the second, . . . and the n-th switch circuits 1100 are driven independently. When part or all of the first, the second, . . . and the n-th switch circuits 1100 close the conductive path 1020, the conductive path 1020 is closed, and when all of the first, the second, . . . and the n-th switch circuits 1100 open the conductive path 1020, the conductive path 1020 is opened.

The drive circuit 1012 inputs the drive signals Sig1, Sig2, . . . and Sig"n" to the first, the second, . . . and the n-th switch circuits 1100, respectively, and causes the first, the second, . . . and the n-th switch circuits 1100 to successively perform an ON operation in which the conductive path 1020 is closed and then opened. This makes a repetition frequency of the pulse voltage higher than a switching frequency of the individual switch circuit 1100. Thus, a pulse voltage having a high repetition frequency can be generated without causing a significant reduction in efficiency.

Here, by the term "successively", it is meant that the switch circuit 1100 that closes the conductive path 1020 in the j-th ON period is different from the switch circuit 1100 that closes the conductive path 1020 in the (j+1)th ON period following the j-th ON period, and each of the plurality of switch circuits 1100 closes the conductive path 1020 once during a time period in which the ON period is repeated n-times, where n is equal to the number n of the switch circuits 1100.

[Switch Circuit]

Each of the switch circuits 1100 includes an SI (static induction) thyristor 1102 and a MOSFET (metal-oxide semiconductor field-effect transistor) 1104. An anode of the SI thyristor 1102 is connected to the other end of the primary winding 1022 of the transformer 1008, and a cathode of the SI thyristor 1102 is connected to a drain of the MOSFET 1104. A source of the MOSFET 1104 is connected to the negative electrode 1018 of the DC source 1006. A gate of the SI thyristor 1102 is connected to the one end of the primary winding 1022 of the transformer 1008 via the diode 1106. An anode of the diode 1106 is connected to the gate of the SI thyristor 1102, and a cathode of the diode 1106 is connected to the one end of the primary winding 1022 of the transformer 1008. A drive signal Sigk (k=1, 2, . . . and n) is inputted to the gate of the MOSFET 1104 from the drive circuit 1012.

When an input of an ON signal to the gate of the MOSFET 1104 is started, the MOSFET 1104 is turned on. When the MOSFET 1104 is turned on, the diode 1106 is reverse-biased and a weak current flows through the diode 1106 into the gate of the SI thyristor 1102, so that the thyristor 1102 is also turned on. Thereby, the switch circuit 1100 closes the conductive path 1020.

When the input of the ON signal to the gate of the MOSFET 1104 is terminated, the MOSFET 1104 is turned off. Thus, the current flowing in the primary winding 1022 of the transformer 1008 is commutated to the gate of the SI thyristor 1102, so that the SI thyristor 1102 is also turned off at a high speed, which causes the switch circuit 1100 to open the conductive path 1020 at a high speed.

The switch circuit 1100 shown in FIG. 1 provides an advantageous effect that a pulse voltage that rises quickly can be generated, but switch circuits of other types may be adopted instead of the switch circuit 1100 shown in FIG. 1.

[Operation of Pulse Generation Circuit]

FIGS. 2 to 5 show changes over time in one cycle from a timing $t_1$ to a timing $t_{2n+1}$, of the drive signal Sig1, the drive signal Sig2, the drive signal Sig"n", and a voltage Vo outputted by the pulse generation circuit 1002, respectively.

Figure 2:
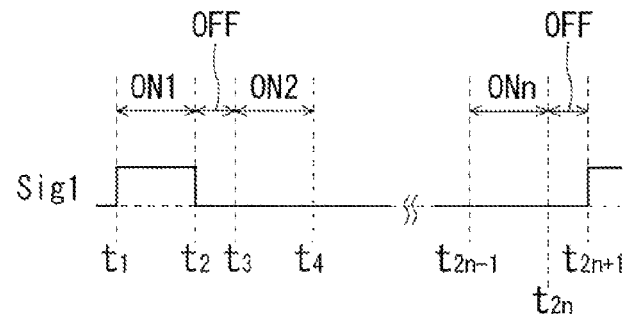
FIG. 2 is a time chart showing a change over time of a drive signal.

As shown in FIG. 2, in an ON period ON1 of the first switch circuit 1100 which is a duration from the timing $t_1$ to a timing $t_2$, the ON signal is inputted to the first switch circuit 1100, and a current flows in the conductive path 1020, so that inductive energy is stored in the transformer 1008.

Figure 5:
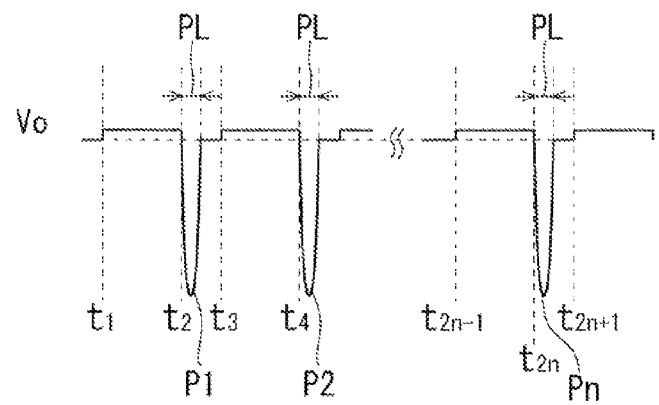
FIG. 5 is a time chart showing a change over time of a voltage outputted by the pulse generation circuit.

As shown in FIG. 5, at the timing $t_2$ when the conductive path 1020 changes from a closed state to an open state, the voltage Vo starts to rapidly increase in a negative direction, so that a pulse voltage P1 occurs.

Figure 3:
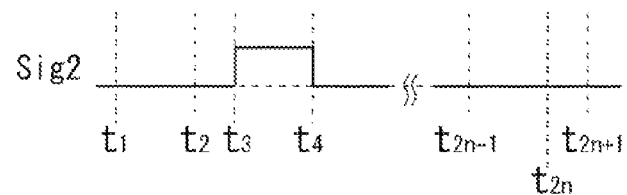
FIG. 3 is a time chart showing a change over time of a drive signal.

As shown in FIG. 3, in an ON period ON2 of the second switch circuit 1100 which is a duration from a timing $t_3$ to a timing $t_4$, the ON signal is inputted to the second switch circuit 1100, so that inductive energy is stored in the transformer 1008.

As shown in FIG. 5, at the timing $t_4$ when the conductive path 1020 changes from the closed state to the open state, the voltage Vo starts to rapidly increase in the negative direction, so that a pulse voltage P2 occurs.

In the same manner, in the ON periods of the third, the fourth, . . . and the (n−1)th switch circuits 1100, the ON signal is inputted to the third, the fourth, . . . and the (n−1)th switch circuits 1100, respectively, so that inductive energy is stored in the transformer 1008. Then, at a timing when the conductive path 1020 changes from the closed state to the open state, a pulse voltage occurs.

Figure 4:
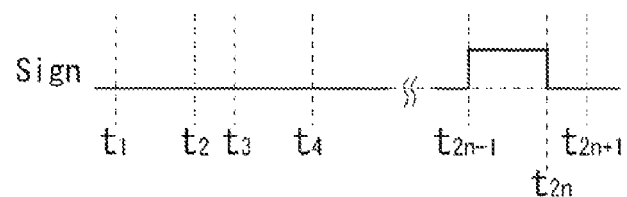
FIG. 4 is a time chart showing a change over time of a drive signal.

As shown in FIG. 4, in an ON period ONn of the n-th switch circuit 1100 which is a final duration in one cycle from a timing $t_{2n-1}$ to the timing $t_{2n}$, the ON signal is inputted to the n-th switch circuit 1100, so that inductive energy is stored in the transformer 1008.

As shown in FIG. 5, at the timing $t_{2n}$ when the conductive path 1020 changes from the closed state to the open state, the voltage Vo starts to rapidly increase in the negative direction, so that a pulse voltage Pn occurs.

An OFF-period, which is a duration from when the conductive path 1020 is opened to when the conductive path 1020 is closed is set longer than a pulse voltage generation period PL. This can avoid a situation where the storing of new inductive energy is started before the stored inductive energy is released in a pulse voltage.

While the invention has been described in detail, the foregoing description is in all aspects illustrative and not restrictive. It is understood that numerous other modifications and variations not illustrated herein can be devised without departing from the scope of the invention.

What is claimed is:

1. A pulse generation circuit comprising:
   a DC source configured to generate a DC voltage between a positive electrode and a negative electrode;
   a conductive path extending from said positive electrode to said negative electrode;
   an inductive element provided in said conductive path;
   a parallel-connected switch-circuits unit including a plurality of switch circuits connected in parallel with one another, said parallel-connected switch-circuits unit being provided in said conductive path and configured such that each of said plurality of switch circuits opens and closes said conductive path in accordance with a drive signal inputted thereto; and
   a drive circuit configured to input, to each of said plurality of switch circuits, a drive signal for causing said plurality of switch circuits to successively perform an ON operation in which said conductive path is closed and then opened,
   wherein
   an ON period which is a duration from when said parallel-connected switch-circuits unit closes said conductive path to when said parallel-connected switch-circuits unit opens said conductive path is followed by a pulse voltage generation period in which a pulse voltage occurs in said inductive element,
   said drive circuit inputs the drive signal to each of said plurality of switch circuits in such a manner that an OFF-period which is a duration from when said conductive path is opened to when said conductive path is closed is longer than said pulse voltage generation period.

* * * * *